United States Patent
Ghosh et al.

(10) Patent No.: US 12,047,042 B2
(45) Date of Patent: Jul. 23, 2024

(54) SWITCHING POWER AMPLIFIER WITH OUTPUT HARMONIC SUPPRESSION

(71) Applicant: Silicon Laboratories Inc., Austin, TX (US)

(72) Inventors: Diptendu Ghosh, Kolkata (IN); Mustafa H. Koroglu, Austin, TX (US); Dayasagar Gaade, Hyderabad (IN); Francesco Barale, North Kingstown, RI (US)

(73) Assignee: Silicon Laboratories Inc., Austin, TX (US)

( * ) Notice: Subject to any disclaimer, the term of this patent is extended or adjusted under 35 U.S.C. 154(b) by 472 days.

(21) Appl. No.: 17/539,090

(22) Filed: Nov. 30, 2021

(65) Prior Publication Data

US 2023/0170855 A1 Jun. 1, 2023

(51) Int. Cl.
*H03F 3/217* (2006.01)
*H03L 7/081* (2006.01)
*H03K 19/20* (2006.01)

(52) U.S. Cl.
CPC .......... *H03F 3/217* (2013.01); *H03L 7/0812* (2013.01); *H03F 2200/165* (2013.01); *H03K 19/20* (2013.01)

(58) Field of Classification Search
CPC ....................................................... H03F 3/217
USPC .............................................. 330/251, 207 A
See application file for complete search history.

(56) References Cited

U.S. PATENT DOCUMENTS

| | | | | |
|---|---|---|---|---|
| 4,777,425 A | * | 10/1988 | MacFarlane | H02P 9/102 322/73 |
| 6,031,746 A | * | 2/2000 | Steigerwald | G01R 33/3852 323/225 |
| 2005/0152561 A1 | * | 7/2005 | Spencer | H04B 11/00 381/77 |

* cited by examiner

*Primary Examiner* — Henry Choe
(74) *Attorney, Agent, or Firm* — Gary Stanford; Huffman Law Group, PC

(57) ABSTRACT

A switching power amplifier with harmonic suppression including a polyphase converter and a power amplifier stage. The polyphase converter converts a frequency or phase modulated input signal into a 50% duty cycle rail-to-rail signal, a positive 25% duty cycle rail-to-rail signal that is centered with the 50% duty cycle signal when high, and a negative 25% duty cycle rail-to-rail signal that is centered with the 50% duty cycle signal when low. The power amplifier stage includes first and second branches coupled between upper and lower nodes, each including series-coupled P-channel and N-channel transistors forming an intermediate output node. The transistors of the first branch are controlled by the 50% duty cycle signal, and the transistors of the second branch are controlled by the positive and negative 25% duty cycle signals. The first and second branches generate output currents that are superimposed with each other to suppress third and fifth harmonics.

20 Claims, 8 Drawing Sheets

SWITCHING POWER AMPLIFIER WITH OUTPUT HARMONIC SUPPRESSION

BACKGROUND OF THE INVENTION

Field of the Invention

The present invention relates in general to switching power amplifiers, and more particularly to a switching power amplifier with output harmonic suppression for meeting spectral mask requirements.

Description of the Related Art

Non-linear switching power amplifiers (PAs) including Class-D output stages and the like operate with amplitude limited signals and achieve excellent efficiency, yet also generate high electromagnetic (EM) emissions at harmonics of the carrier frequency. Often such amplifiers require harmonic mitigation techniques to meet stringent out-of-band emission requirements set by various regulatory agencies, such as, for example, the Federal Communications Commission (FCC) in the United States. Conventional means for reducing such emissions include high-order matching networks that reduce conducted harmonic power. Such high-order matching networks, however, result in an increased number of components and do not effectively address the EM radiation caused by harmonic currents in the bondwire connecting the chip die to the package lead-frame and radiating loops closed by the printed circuit board (PCB).

On-chip harmonic traps, such as, for example, series inductive-capacitive (LC) resonators tuned to specific harmonics providing an alternate low impedance shunt path to ground have been used to reduce the radiated harmonic power. Such solutions, however, often require on-chip passive devices which consume a significant amount of valuable circuit area. In addition, such implementations provide limited on-chip Q of the passive devices and component variation which places a bound on the maximum achievable harmonic suppression. Controlling the transient metrics, such as the rise and fall times of the pre-driver output to bring about a gradual transition of the PA switch resistance between ON and OFF states, reduces the harmonic content but results in a simultaneous significant reduction of efficiency because of a substantial reduction of output power at the fundamental frequency.

SUMMARY OF THE INVENTION

A switching power amplifier with harmonic suppression according to one embodiment includes a polyphase converter and a power amplifier stage. The polyphase converter converts a frequency or phase modulated input signal into rail-to-rail signals that each transition between a first rail and a second rail, including a 50% duty cycle rail-to-rail signal, a positive 25% duty cycle rail-to-rail signal that is high 25% of the time while being centered within the 50% duty cycle rail-to-rail signal when high, and a negative 25% duty cycle rail-to-rail signal that is low 25% of the time while being centered within the 50% duty cycle rail-to-rail signal when low. The power amplifier stage includes first and second branches coupled between upper and lower nodes, each including series-coupled P-channel and N-channel transistors coupled together at an intermediate output node. The transistors of the first branch have control terminals receiving the 50% duty cycle rail-to-rail signal. The P-channel transistor of the second branch has a control terminal receiving the negative 25% duty cycle rail-to-rail signal. The N-channel transistor of the second branch has a control terminal receiving the positive 25% duty cycle rail-to-rail signal.

In this manner, when applied to a broadband load, the first branch generates a first output current having about a 50% duty cycle, and the second branch generates a second output current having about a 25% duty cycle that is superimposed together with the first output current. The collective superimposed current performs harmonic cancellations, including, for example, suppressing the third and fifth harmonics at the output for meeting spectral mask requirements of the transmitted power.

The polyphase converter may be configured to transition the negative 25% duty cycle rail-to-rail signal to activate the second P-channel transistor in the second branch for about 25% of each cycle, and may also be configured to transition the positive 25% duty cycle rail-to-rail signal to activate the second N-channel transistor in the second branch for about 25% of each cycle.

The polyphase converter may include a polyphase filter, limiting amplifier circuitry, and combinational circuitry. The polyphase filter converts a sinusoidal input signal into a positive 45 degree phase-shifted sinusoidal signal, a non-shifted amplitude adjusted sinusoidal signal, and a negative 45 degree phase-shifted sinusoidal signal. The limiting amplifier circuitry converts the positive 45 degree phase-shifted sinusoidal signal, the non-shifted amplitude adjusted sinusoidal signal, and the negative 45 degree phase-shifted sinusoidal signal into a positive 45 degree phase-shifted rail-to-rail signal, a non-shifted rail-to-rail signal, and a negative 45 degree phase-shifted rail-to-rail signal, respectively. The combinational circuitry logically combines the positive and negative 45 degree phase-shifted rail-to-rail signals into the positive 25% duty cycle rail-to-rail signal and into the negative 25% duty cycle rail-to-rail signal. The combinational circuitry may further include a delay matching buffer that delays the non-shifted rail-to-rail signal to provide the 50% duty cycle rail-to-rail signal delay matched with the positive and negative 25% duty cycle rail-to-rail signals.

The polyphase filter may include a high-pass capacitor-resistor filter, a capacitive attenuating matching circuit, and a low-pass resistor-capacitor filter. In one embodiment, the high-pass capacitor-resistor filter, the capacitive attenuating matching circuit, and the low-pass resistor-capacitor filter may each be tuned based on a predetermined transmission frequency. The limiting amplifier circuitry may include amplitude limiting buffers. The combinational circuitry may be configured with Boolean logic gates or the like for providing the positive and negative 25% duty cycle rail-to-rail signals.

The polyphase converter may include a delay-locked loop (DLL) and the combinational circuitry. The DLL may include a delay line with series-coupled inverters for providing the phase-shifted and non-shifted rail-to-rail signals. A phase-locked loop circuit may provide the frequency or phase modulated input signal as a rail-to-rail signal provided to the DLL. An amplitude limiting buffer may convert a frequency or phase modulated sinusoidal input signal to a corresponding rail-to-rail signal provided to the DLL.

The switching power amplifier may include non-overlap generation circuitry that generates non-overlapping P-type and N-type drive rail-to-rail signals for driving the P-channel and N-channel transistors when harmonic suppression is disabled.

A method of suppressing harmonics of a switching power amplifier according to one embodiment includes converting a frequency or phase modulated input signal into rail-to-rail signals that each transition between a first rail and a second rail, including a 50% duty cycle rail-to-rail signal, a positive 25% duty cycle rail-to-rail signal that is high 25% of the time while being centered within the 50% duty cycle rail-to-rail signal when high, and a negative 25% duty cycle rail-to-rail signal that is low 25% of the time while being centered within the 50% duty cycle rail-to-rail signal when low, driving an upper P-channel transistor and a lower N-channel transistor of a first branch of a power amplifier circuit with the 50% duty cycle rail-to-rail signal, driving an upper P-channel transistor of a second branch that is coupled in parallel with the first branch of the power amplifier circuit with the negative 25% duty cycle rail-to-rail signal, and driving a lower N-channel transistor of the second branch of the power amplifier circuit with the positive 25% duty cycle rail-to-rail signal.

The method may include shifting phase of a sinusoidal input signal forward by 45 degrees to provide a positive 45 degree phase-shifted sinusoidal signal, shifting phase of the sinusoidal input signal backward by 45 degrees to provide a negative 45 degree phase-shifted sinusoidal signal, adjusting amplitude of the sinusoidal input signal to provide a non-shifted amplitude adjusted sinusoidal signal, converting amplitude of the positive 45 degree phase-shifted sinusoidal signal, the non-shifted amplitude adjusted sinusoidal signal, and the negative 45 degree phase-shifted sinusoidal signal to provide a positive 45 degree phase-shifted rail-to-rail signal, a non-shifted rail-to-rail signal, and a negative 45 degree phase-shifted rail-to-rail signal, respectively, logically combining the positive 45 degree phase-shifted rail-to-rail signal and the negative 45 degree phase-shifted rail-to-rail signal to provide a positive 25% duty cycle rail-to-rail signal and a negative 25% duty cycle rail-to-rail signal, and delaying the non-shifted rail-to-rail signal to provide a 50% duty cycle rail-to-rail signal that is delayed equally in time as a delay of the positive and negative 25% duty cycle rail-to-rail signals.

The method may include high pass filtering the sinusoidal input signal to provide the positive 45 degree phase-shifted sinusoidal signal, low pass filtering the sinusoidal input signal to provide the negative 45 degree phase-shifted sinusoidal signal, and capacitively attenuating the sinusoidal input signal to provide the non-shifted amplitude adjusted sinusoidal signal.

The method may include passing the positive 45 degree phase-shifted sinusoidal signal, the non-shifted amplitude adjusted sinusoidal signal, and the negative 45 degree phase-shifted sinusoidal signal through first, second, and third amplitude limiting buffers, respectively, to provide the positive 45 degree phase-shifted rail-to-rail signal, the non-shifted rail-to-rail signal, and the negative 45 degree phase-shifted rail-to-rail signal, respectively.

The method may include logically OR'ing the positive 45 degree phase-shifted rail-to-rail signal and the negative 45 degree phase-shifted rail-to-rail signal to provide the negative 25% duty cycle rail-to-rail signal, and logically AND'ing the positive 45 degree phase-shifted rail-to-rail signal and the negative 45 degree phase-shifted rail-to-rail signal to provide the positive 25% duty cycle rail-to-rail signal.

The method may include providing a rail-to-rail input signal to a delay-locked loop including a multiple phase delay line having selected outputs configured to provide a positive 45 degree phase-shifted rail-to-rail signal, a non-shifted rail-to-rail signal, and a negative 45 degree phase-shifted rail-to-rail signal, logically combining the positive 45 degree phase-shifted rail-to-rail signal and the negative 45 degree phase-shifted rail-to-rail signal to provide a positive 25% duty cycle rail-to-rail signal and a negative 25% duty cycle rail-to-rail signal, and delaying the non-shifted rail-to-rail signal to provide a 50% duty cycle rail-to-rail signal that is delayed equally in time as a delay of the positive and negative 25% duty cycle rail-to-rail signals.

The method may include generating a P-type drive rail-to-rail signal by logically OR'ing the 50% duty cycle rail-to-rail signal with an N-type drive rail-to-rail signal, generating the N-type drive rail-to-rail signal by logically AND'ing the 50% duty cycle rail-to-rail signal with the P-type drive rail-to-rail signal, in which the P-type drive and N-type drive rail-to-rail signals are non-overlapping, and disabling harmonic suppression by driving the upper P-channel transistors of the first and second branches of the power amplifier circuit with the P-type drive rail-to-rail signal and driving the lower N-channel transistors of the first and second branches of the power amplifier circuit with the N-type drive rail-to-rail signal.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

A switching power amplifier with output harmonic suppression as described herein uses multiple phase signals generated using first order resistance-capacitance (RC) phase shifters to drive parallel branches in a power amplifier (PA) output stage to achieve harmonic cancellation. Harmonic cancellation is achieved through the superposition of resulting output currents thereby meeting the spectral mask requirements of the transmitted power. The switching power amplifier, therefore, does not need any additional external passives for filtering or on-chip inductors for realizing band-stop response at the harmonics for achieving the reduced out-of-band emissions. It is noted, however, that such harmonic traps and external filtering may still be added to further reduce signal components at harmonics if desired.

The third and fifth harmonics are both reduced using the current cancellation principle. Unlike conventional harmonic rejection topologies, a switching power amplifier as described herein uses a combination of 50% duty cycle (DC) and 25% DC signals thereby minimally impacting the efficiency. Herein, duty cycle refers to the fraction of the total period for which a device being driven is in the ON-state (low resistance) due to the given drive. Cancellation of harmonic current flowing out of the PA and through a bondwire connecting the PA output to the lead frame also reduces the radiated component of spectral emission which is generally not as effectively reduced by complex off-chip matching. In applications requiring relaxed harmonic suppression specification, the system and method as described herein can be used to reduce the complexity of an off-chip or external matching network or be reconfigured into conventional Class-D stage delivering higher maximum power. An implementation of harmonic rejection as described herein may also considerably accelerate silicon validation time by reducing the number of iterations on the matching network side. Relying less on the matching network to attenuate the $3^{rd}$ and $5^{th}$ harmonics should also make the deployment of the design more robust to different printed circuit board (PCB) layout designs.

Figure 1:
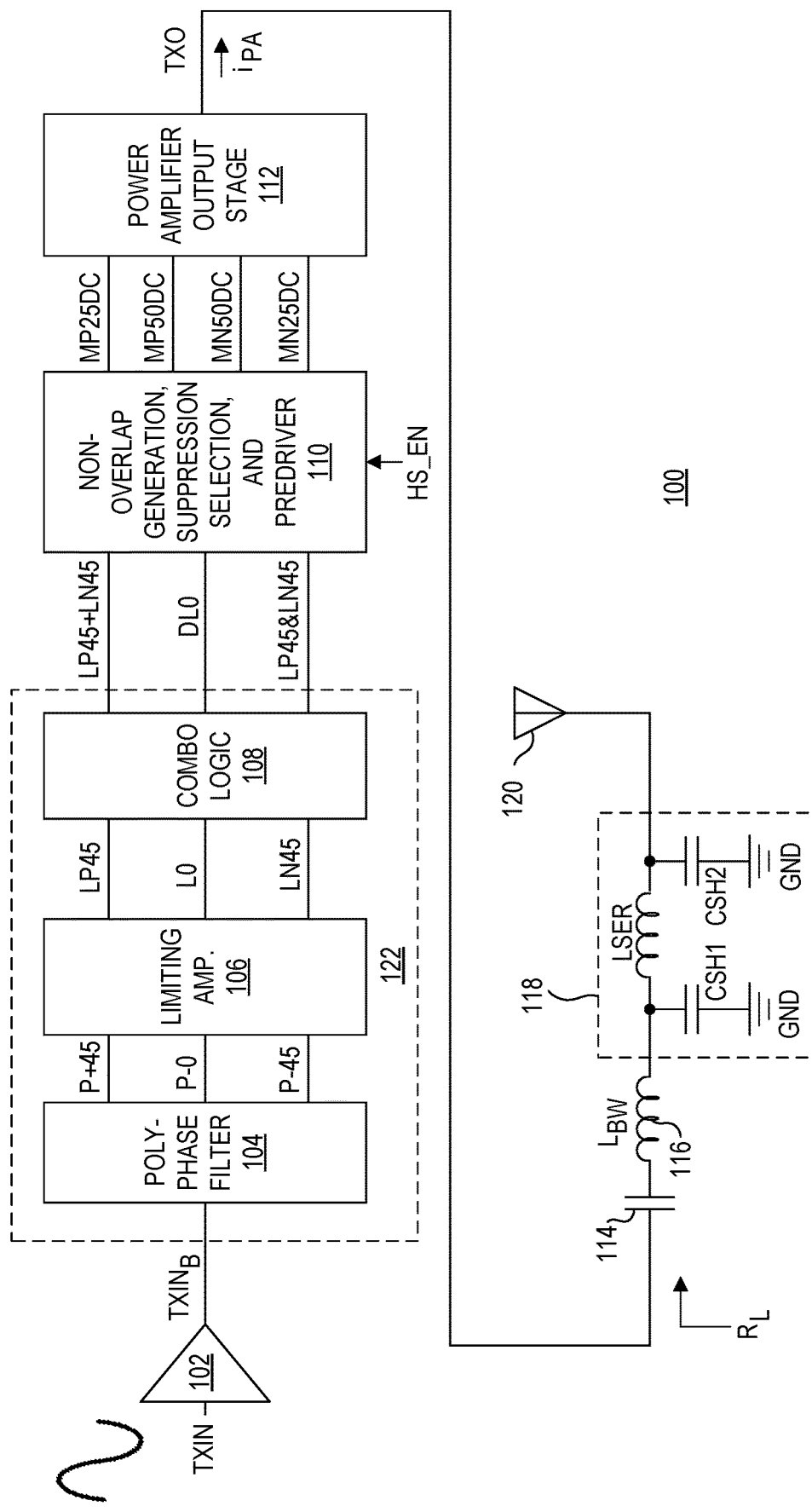
FIG. 1 is a simplified block diagram of a power amplifier (PA) output stage implemented according to one embodiment of the present disclosure.

FIG. 1 is a simplified block diagram of a power amplifier (PA) output stage 100 implemented according to one embodiment of the present disclosure. An upconverted input transmit signal TXIN for transmission is provided to the input of a buffer 102, which has an output providing a buffered TX signal $TXIN_B$ to an input of a polyphase filter 104. The TXIN signal, and thus also the $TXIN_B$ signal, is generally a sinusoidal signal that has been upconverted to a center carrier frequency of transmission (fix), such as a sub-gigahertz (GHz) frequency at 900 megahertz (MHz) or other lower frequency levels, or other higher carrier frequency levels, such as, for example, 2.4 GHz, 5 GHz, 10 GHz, etc. The TXIN signal, and thus also the $TXIN_B$ signal, is a frequency modulated signal or a phase modulated signal. In the illustrated embodiment, the PA output stage 100 is configured as a switching PA based on the Class-D principle of operation supporting phase or frequency modulation. Typical standards operating with these modulation schemes include Bluetooth®, Bluetooth® Low-Energy (BLE), Zig-Bee, among many others supporting different modulation formats, such as Gaussian Frequency Shift Keying (GFSK), Quadrature Phase Shift Keying (QPSK), offset QPSK (O-QPSK), etc.

$TXIN_B$ is provided to an input of a polyphase filter 104, which performs phase-shifting as described herein and outputs three corresponding sinusoidal signals including two phase-shifted signals P+45 and P−45 (each phase shifted by 45 degrees in opposite directions or polarities) and a non-shifted amplitude adjusted signal P−0. The P+45, P−0, and P−45 sinusoidal signals are provided to respective inputs of limiting amplifier circuitry 106, which converts the sinusoidal signals into corresponding rail-to-rail signals LP45, L0, and LN45, respectively. The LP45, L0, and LN45 rail-to-rail signals are provided to respective inputs of combinational (COMBO) circuitry 108, which logically combines the LP45 and LN45 into two synchronized rail-to-rail signals LP45+LN45 and LP45&LN45 and which delays L0 by a matching amount to provide a delayed signal DL0 that is delay matched with LP45+LN45 and LP45&LN45 path delays. As used herein, "rail-to-rail" signals generally include those which transition between the applicable supply voltages or rails, including a first rail such as a supply reference level, such as ground (GND), and a second rail, such as a supply voltage level VDD relative to GND.

The LP45+LN45, DL0, and LP45&LN45 rail-to-rail signals are provided to respective inputs of non-overlap generation, suppression selection and pre-driver circuitry 110. The non-overlap generation, suppression selection and pre-driver circuitry 110 receives the LP45+LN45, DL0, and LP45&LN45 signals and provides four signals MP25DC, MP50DC, MN50DC, and MN25DC to corresponding inputs of a power amplifier output stage 112. The actual form of each of the MP25DC, MP50DC, MN50DC, and MN25DC signals depends upon a harmonic suppression enable (HS_EN) signal provided to a control or select input of the non-overlap generation, suppression selection and pre-driver circuitry 110. When the HS_EN signal is asserted to enable harmonic suppression, then the MP25DC, MP50DC, MN50DC, and MN25DC signals drive the power amplifier output stage 112 in such a manner that the third and fifth harmonic frequencies of the transmit frequency are substantially suppressed or reduced. When the HS_EN signal is de-asserted to disable harmonic suppression, then the MP25DC, MP50DC, MN50DC, and MN25DC signals drive the power amplifier output stage 112 to operate without harmonic suppression with minimal impact on efficiency as further described herein. The HS_EN signal may be de-asserted, for example, for applications intended to be operate in areas with relaxed suppression specifications. The power amplifier output stage 112 receives the MP25DC, MP50DC, MN50DC, and MN25DC signals and generates a transmit output (TXO) signal at an output.

TXO is provided through an AC coupling capacitor 114 and a bondwire inductance 116 (having inductance $L_{BW}$) coupled in series between the power amplifier output stage 112 and an input of an off-chip matching network 118. The matching network 118 has an output coupled to an antenna 120 for wireless transmission. In one embodiment, the matching network 118 may be configured as a 3-element PI-matching circuit including a series inductor LSER and a pair of shunt capacitors CSH1 and CSH2. As shown, for example, LSER has a first terminal coupled to the inductor 116 and a second terminal coupled to the antenna 120, CSH1 is coupled between the first terminal of LSER and a reference node, such as GND, and CSH2 is coupled between the second terminal of LSER and GND. Alterative matching networks may be employed. An output current $i_{PA}$ of the power amplifier output stage 112 flows into the load $R_L$, shown as the load looking into the capacitor 114.

It is noted that the polyphase filter 104, the limiting amplifier circuitry 106 and the combinational circuitry 108 collectively form a polyphase converter 122 that may be used to convert the buffered input transmit signal $TXIN_B$ into the 50% duty cycle signal L0, the positive 25% duty cycle signal LP45+LN45 and the negative 25% duty cycle signal LP45&LN45.

Figure 2:
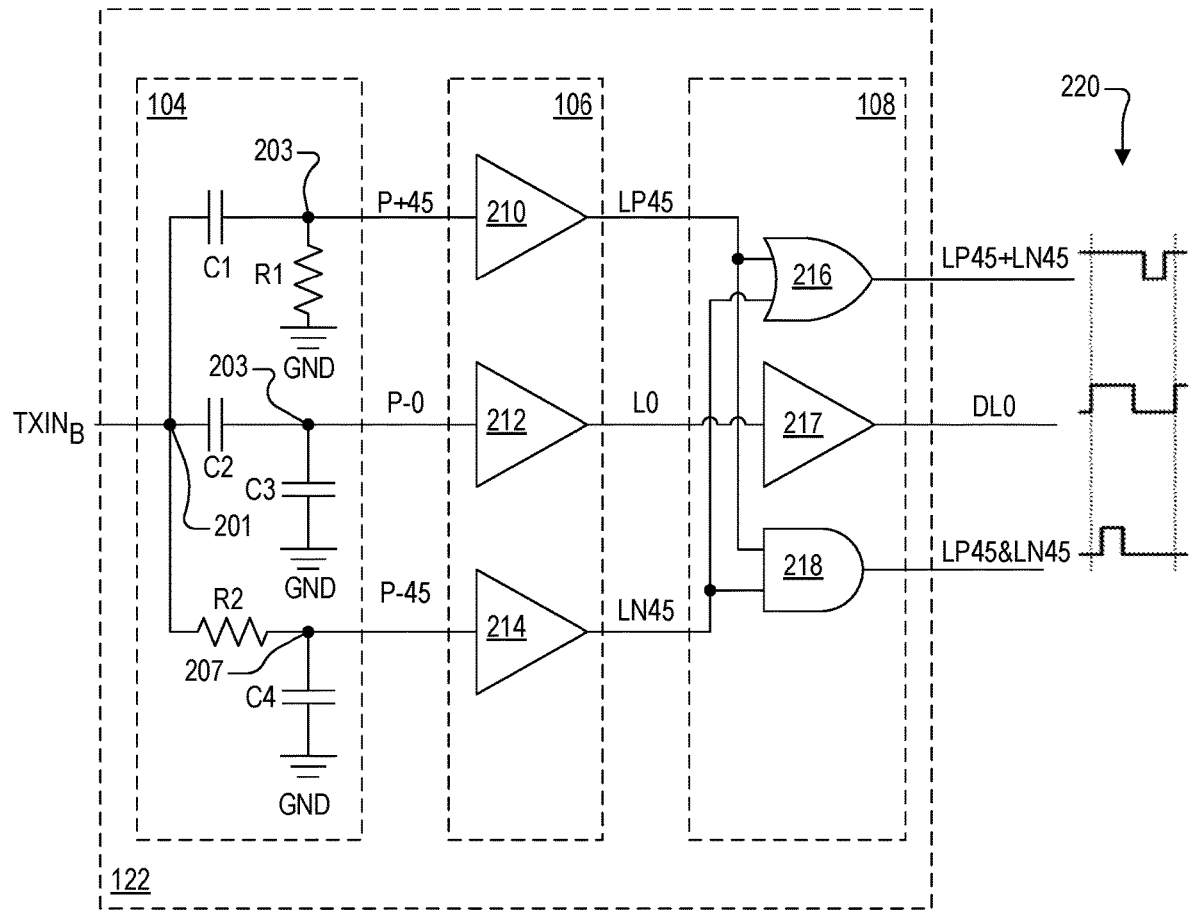
FIG. 2 is a schematic diagram illustrating the polyphase converter of FIG. 1, including the polyphase filter, the limiting amplifier circuitry and the combinational circuitry of FIG. 1 each implemented according to one embodiment of the present disclosure.

FIG. 2 is a schematic diagram illustrating the polyphase converter 122, including the polyphase filter 104, the limiting amplifier circuitry 106 and the combinational circuitry 108 each implemented according to one embodiment of the present disclosure. $TXIN_B$ is provided to a node 201, which is further coupled to one end of a capacitor C1 of a first branch, to one end of another capacitor C2 of a second branch, and to one end of a resistor R2 of a third branch. In the first branch, the other end of the capacitor C1 is coupled to a node 203 which is further coupled to one end of a resistor R1 having its other end coupled to GND. The capacitance of C1 and the resistance of R1 are selected to shift the phase of $TXIN_B$ forward by a positive 45 degrees (°) for developing the P+45 signal on node 203. In the second branch, the other end of the capacitor C2 is coupled to a node 205 which is further coupled to one end of another capacitor C3 having its other end coupled to GND. The capacitances of C2 and C3 are selected to attenuate $TXIN_B$ by about the same amount as the first and third branches with 0° phase shift (or non-shifted) for developing the P–0 signal on node 205. In the third branch, the other end of the resistor R2 is coupled to a node 207 which is further coupled to one end of another capacitor C4 having its other end coupled to GND. The resistance of R2 and the capacitance of C4 are selected to shift the phase of $TXIN_B$ backward by a negative 45° for developing the P–45 signal on node 203.

C1 and R1 form a first high pass filtering (HPF-CR) path, C2 and C3 form a second capacitive attenuator path for amplitude matching across the first, second, and third branches, and R2 and C4 form a third low pass filtering (LPF-RC) path. The RC corner frequency for the HPF and the LPF paths are calibrated to be at the transmit frequency fix so that the paths give a ±45° phase shift relative to the capacitive attenuator at this frequency.

The limiting amplifier circuitry 106 includes a first limiting amplifier 210, a second limiting amplifier 212, and a third limiting amplifier 214. The P+45 signal is provided to the input of the limiting amplifier 210 having an output providing the LP45 signal, the P–0 signal is provided to the input of the limiting amplifier 212 having an output providing the L0 signal, and the P–45 signal is provided to the input of the limiting amplifier 214 having an output providing the LN45 signal. Each of the limiting amplifiers 210, 212, and 214 operate as an amplitude limiting buffer (substantially similar to a comparator with a rail-to-rail output) for converting sinusoidal signals P+45, P–0, and P–45 to corresponding rail-to-rail signals LP45, L0, and LN45, respectively. It is appreciated that whereas amplitude information is not ideally preserved, phase and frequency information is retained according to Class-D operation. It is noted that the P+45, P–0, and P–45 rail-to-rail signals are essentially 50% duty cycle (DC) signals that maintain 50% DC even during phase and/or frequency modulation of the transmitted signal.

The combinational circuitry 108 includes a 2-input Boolean logic OR gate 216, a delay matching buffer 217, and a 2-input Boolean logic AND gate 218. The LP45 and LN45 signals are provided to the respective inputs of the OR gate 216 having an output providing the LP45+LN45 signal, in which the "+" within the signal name denotes the logical OR operation rather than the mathematical addition operation. The LP45 and LN45 signals are also provided to the respective inputs of the AND gate 218 having an output providing the LP45&LN45 signal, in which the "&" within the signal name denotes the logical AND operation rather than the mathematical multiplication operation. The L0 signal is provided to an input of the buffer 217, having an output providing the delayed signal DL0 which remains a 50% DC signal. The buffer 217 has a delay that substantially matches the delays of the gates 216 and 218 to maintain time delay matching between the LP45+LN45, LP45&LN45, and DL0 signals.

As a result of the logical combination as illustrated by a timing diagram graphic 220, the LP45+LN45 and LP45&LN45 are both 25% DC signals, in which LP45+LN45 remains high at the second rail, or VDD, about 75% of the time while going low to the first rail, or GND, about 25% of the time, whereas the LP45&LN45 remains low at the first rail GND about 75% of the time while going high to the second rail VDD about 25% of the time. In addition, the LP45+LN45 and LP45&LN45 signals are both generally delay matched and centered with DL0 signal as further illustrated by the timing diagram graphic 220. As further described and illustrated herein, when LP45+LN45 is low at the first rail (GND), it is centered within the DL0 signal when it is also low at the first rail, and when LP45&LN45 is high at the second rail (VDD), it is centered within the DL0 when it is also high at the second rail.

Figure 3:
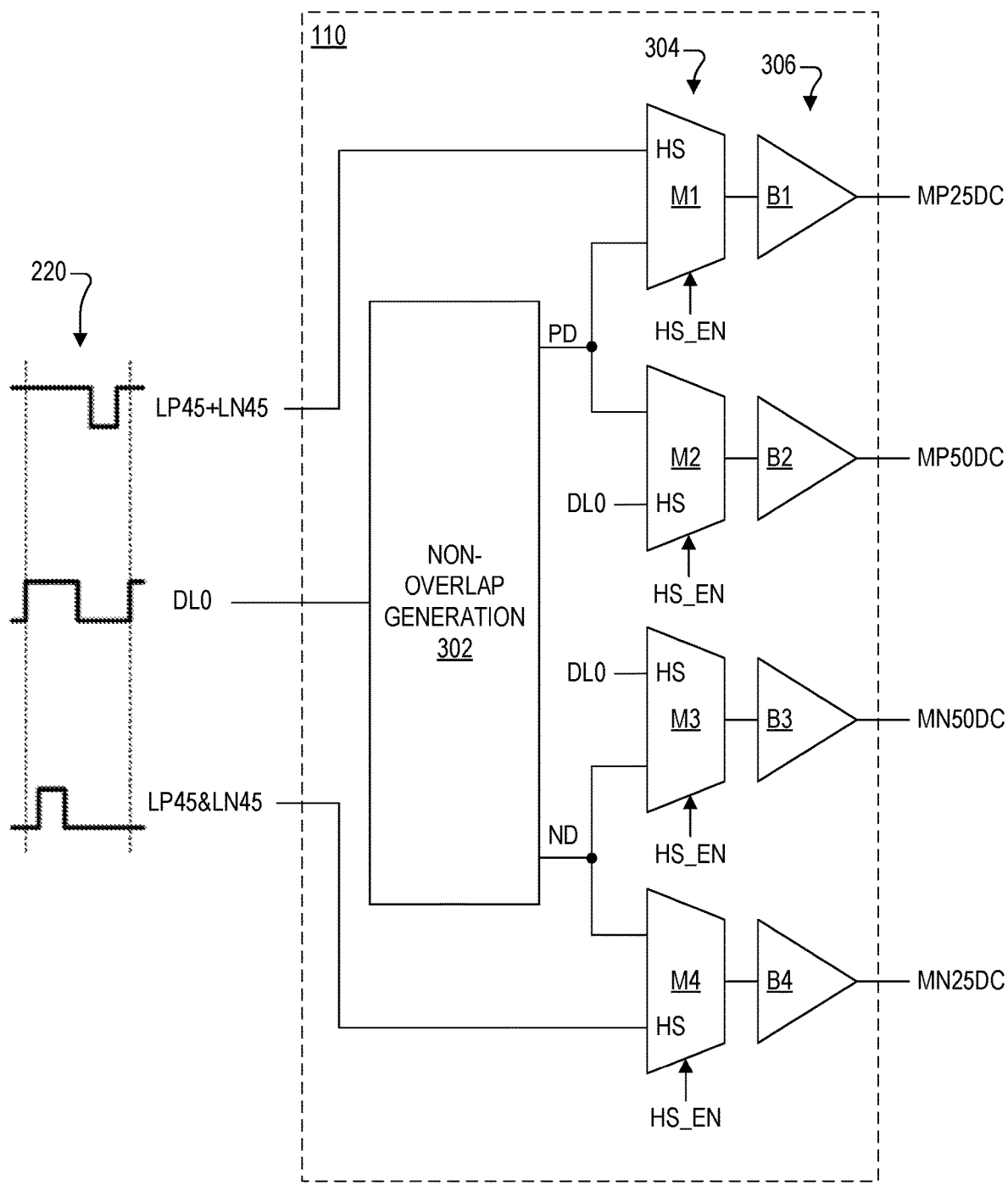
FIG. 3 is a simplified block diagram of the non-overlap generation, suppression selection and pre-driver circuitry of FIG. 1 implemented according to one embodiment of the present disclosure.

FIG. 3 is a simplified block diagram of the non-overlap generation, suppression selection and pre-driver circuitry 110 implemented according to one embodiment of the present disclosure. The non-overlap generation, suppression selection and pre-driver circuitry 110 includes non-overlap generation circuitry 302, suppression selection circuitry 304, and pre-driver circuitry 306. The timing diagram graphic 220 is repeated to illustrate the LP45+LN45, DL0 and LP45&LN45 signals provided to respective inputs. DL0 is shown provided to an input of the non-overlap generation circuitry 302, having a first output providing a P-type drive signal PD and having a second output providing an N-type drive signal ND. Operation of the non-overlap generation circuitry 110 for converting the DL0 signal into the PD and ND signals is described further below.

The select circuitry 304 includes four 2-input multiplexers (MUXes) M1, M2, M3, and M4 and the pre-driver circuitry 306 includes buffer circuitry individually shown as four corresponding buffers B1, B2, B3, and B4. LP45+LN45 is provided to an "HS" input of MUX M1 (in which "HS" denotes the harmonic suppression selection), which receives the PD signal at its other input and which has an output coupled to an input of buffer B 1. DL0 is provided to an HS input of MUX M2, which receives the PD signal at its other input and which has an output coupled to an input of the buffer B2. DL0 is also provided to an HS input of MUX M3, which receives the ND signal at its other input and which has an output coupled to an input of the buffer B3. LP45&LN45 is provided to an HS input of MUX M4, which receives the ND signal at its other input and which has an output coupled to an input of the buffer B4. The outputs of the buffers B1, B2, B3, and B4 provide the MP25DC, MP50DC, MN25DC, and MN50DC signals, respectively.

Each of the MUXes M1-M4 has a select input receiving the HS_EN signal. When HS_EN is asserted for enabling harmonic suppression, each of the MUXes M1-M4 selects its HS input for providing its output signal. Otherwise, when HS_EN is de-asserted for disabling harmonic suppression, each of the MUXes M1-M4 selects its other or non-HS input as its output. In this manner, when HS_EN is asserted to enable harmonic suppression, LP45+LN45 is used to generate the MP25DC signal, DL0 is used to generate both the MP50DC and the MN50DC signals, and LP45&LN45 is used to generate the MN25DC signal. When HS_EN is de-asserted for disabling harmonic suppression, signal PD is used to provide both the MP25DC and MP50DC signals, whereas signal ND is used to provide both the MN50DC and MN25DC signals.

The buffers 306 are each configured for driving large capacitive loads of the power amplifier output stage 112. Although not specifically shown, each of the buffers B1-B4 may be configured as a cascade of tapered buffers suitable for driving the capacitive loads of the power amplifier output stage 112.

It is noted that for embodiments in which harmonic suppression is required and always enabled, the non-overlap generation and suppression selection portions of the circuitry 110 may be omitted. Instead, the LP45+LN45 signal may be buffered via buffer B1 as the MP25DC signal, the DL0 signal may be buffered via the buffers B2 and B3 as the MP50DC and MN50DC signals, respectively, and the LP45&LN45 signal may be buffered via the buffer B4 as the MN25DC signal.

Figure 4:
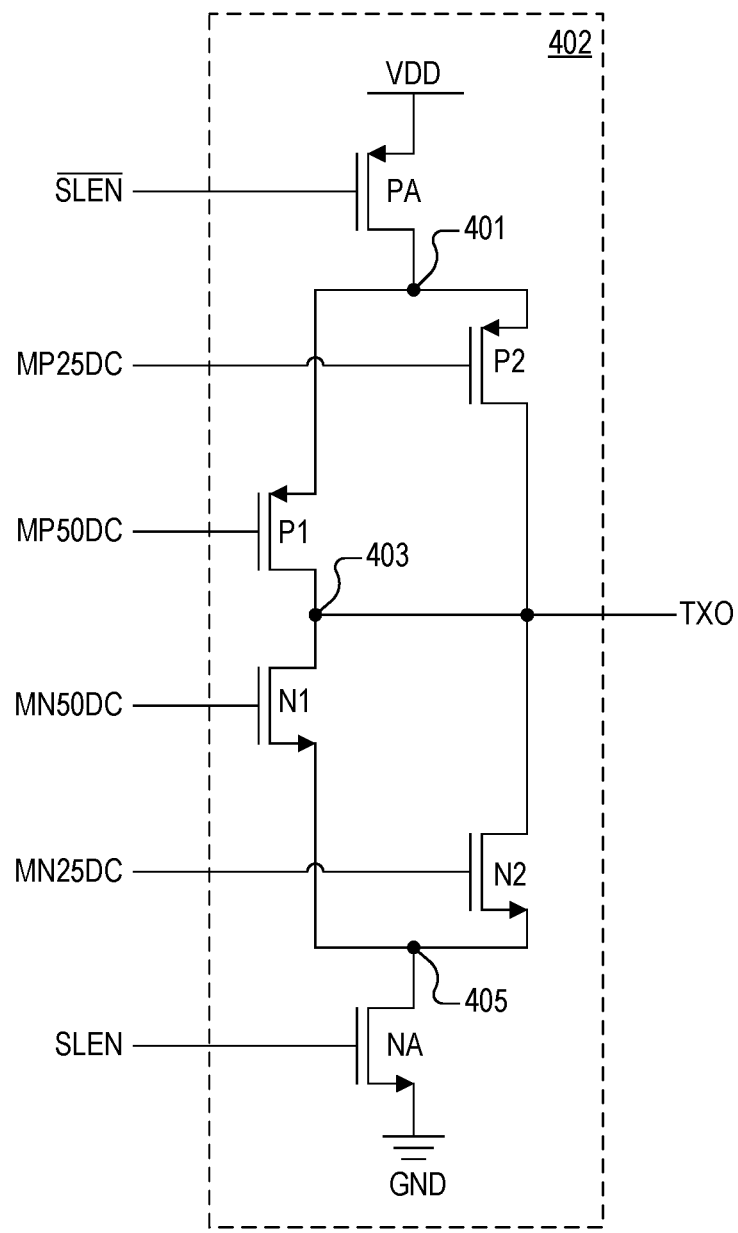
FIG. 4 is a schematic diagram of a PA output slice which may be used to implement at least a portion of the power amplifier output stage of FIG. 1 according to one embodiment of the present disclosure.

FIG. 4 is a schematic diagram of a PA output slice 402 which may be used to implement at least a portion of the power amplifier output stage 112 according to one embodiment of the present disclosure. The PA output slice 402 is representative of the entire power amplifier output stage 112 in which multiple slices are coupled in parallel and selectively activated based on the desired power level. The PA output slice 402 includes P-channel transistors PA, P1 and P2 and N-channel transistors NA, N1 and N2. The P-channel and N-channel transistors are shown as MOS-type transistors (e.g., PMOS, NMOS), where it is understood that alternative types of transistors may be used. The PA output slice 402 is enabled by a slice enable signal SLEN and an inverted enable signal SLEN, which are binary complements of each other. The PA output slice 402 receives the MP25DC, MP50DC, MN50DC, and MN25DC signals and outputs the TXO signal.

PA has a source terminal coupled to VDD, a gate terminal receiving SLEN, and a drain terminal coupled to an upper node 401. P1 has a source terminal coupled to node 401, a gate terminal receiving MN50DC, and a drain terminal coupled to an output node 403 developing the TXO signal. N1 has a drain terminal coupled to the output node 403, a gate terminal receiving MN50DC, and a source terminal coupled to a lower node 405. NA has a drain terminal coupled to node 405, a gate terminal receiving SLEN, and a source terminal coupled to GND. P2 has a source terminal coupled to node 401, a gate terminal receiving MP25DC, and a drain terminal coupled to the output node 403. N2 has a drain terminal coupled to the output node 403, a gate terminal receiving MN25DC, and a source terminal coupled to node 405.

It is noted that the "MP" signals MP25DC and MP25DC are rail-to-rail signals used to drive the P-channel or P-type transistors P1 and P2, respectively, whereas the "MN" signals MN50DC and MN25DC are rail-to-rail signals used to drive the N-channel or N-type transistors N1 and N2, respectively. The numeric value within the signal name, namely 25 and 50, each denote the percentage of time that the corresponding transistor is activated or turned on each cycle. Thus, P1 is turned on about 50% of the time (or per cycle) by signal MP50DC, N1 is turned on about 50% of the time (or per cycle) by signal MN50DC, P2 is turned on about 25% of the time by signal MP25DC, and N2 is turned on about 25% of the time by signal MN25DC. It is further noted that MP25DC may be referred to as a "negative" 25% duty cycle rail-to-rail signal which is nominally at the second rail, such as VDD, and transitions to the second rail, such as to GND, for 25% of the time (or per cycle). Also, MN25DC may be referred to as a "positive" 25% duty cycle rail-to-rail signal which is nominally at the first rail, such as GND, and transitions to the second rail, such as to VDD, for 25% of the time (or per cycle).

Figure 5:
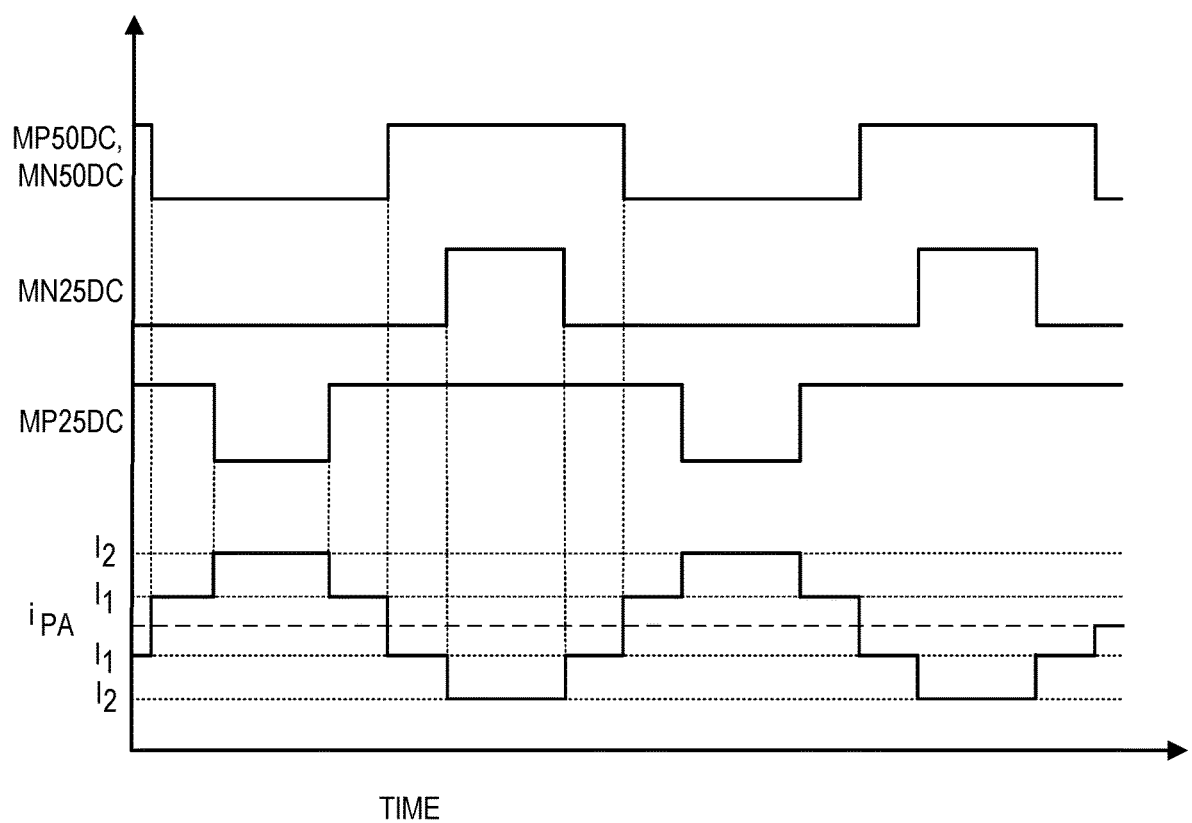
FIG. 5 is a timing diagram plotting approximations of the MP50DC, MN50DC, MN25DC, and MP25DC signals versus time along with the PA output current versus time for the case in which harmonic suppression is enabled according to one embodiment of the present disclosure.

FIG. 5 is a timing diagram plotting approximations of the MP50DC, MN50DC, MN25DC, and MP25DC signals along with the PA output current $i_{pA}$ at the output of the power amplifier output stage 112 (and assuming broadband load $R_L$) versus time for the case in which harmonic suppression is enabled according to one embodiment of the present disclosure. Harmonic suppression is enabled by asserting HS_EN as previously described. The signals are plotted as approximations since shown in idealized format without phase or frequency variations.

The MP50DC and MN50DC signals are plotted together as essentially the same signal. With reference back to FIG. 4, however, it is noted that since MP50DC is applied to P1 whereas MN50DC is applied to N1, that these two transistors are activated in an alternative manner using the same signal. The MN25DC signal only goes high to the second rail about 25% of the time (for turning on N2 about 25% of the time), which occurs after MP50DC/MN50DC goes high and goes low before MP50DC/MN50DC goes back low during each cycle. In addition, each high pulse of MN25DC is substantially centered within the half cycle of MP50DC/MN50DC while at the second or upper voltage rail VDD. In a similar manner, MP25DC only goes low to the first rail about 25% of the time (for turning on P2 about 25% of the time) which occurs after MN50DC/MN50DC goes low and goes high before MP50DC/MN50DC goes back high during each cycle. In addition, each low pulse of MP25DC is substantially centered within the half cycle of MP50DC/MN50DC while at the first or lower supply voltage rail GND.

The activation of the two parallel switching stages driven with the orthogonal set of gate drive signals MP50DC and MN50DC (50% duty cycle), and MP25DC and MN25DC (25% duty cycle), in which the 25% duty cycle signals are symmetrically positioned with respect to the 50% duty cycle signals, results in the superposition of currents $I_1$ and $I_2$ forming the total current $i_{pA}$. $I_1$ is the current generated by the first parallel branch including P1 and N1 driven by the 50% DC signals and 12 is the current generated by the second parallel branch including P2 and N2 driven by the 25% DC signals.

For each of the half-cycles when the TXO output gets connected to the supply VDD or to GND, through assumed symmetric pull-up and pull-down switches, the circuit has two regions of operation characterized by on resistances of $R_{on\_50DC}$ and $R_{on\_50DC} \| R_{on\_25DC}$, in which "||" denotes a parallel configuration, $R_{on\_50DC}$ is the resistance of the PA output slice 402 driven by the MP50DC and MN50DC signals, and $R_{on\_25DC}$ is the resistance of the PA output slice 402 driven by the MP25DC and MN25DC signals. By suitable choice of the above resistance ratio suppression of the output currents at the third (H3) and fifth (H5) harmonics can be achieved for a given resistive load termination. In the presence of reactive harmonic termination in which the load presented at the harmonics are not necessarily real as it is the case generally for fundamental, to get highest efficiency, the suppression is lower in magnitude but still sufficient nominally for the H3-H5 for a reference design.

The output current $i_{pA}$ of the power amplifier output stage 112, which is formed by the superposition of currents $I_1$ and $I_2$ due to aforesaid 50DC and 25DC voltage excitations, can be shown to be having a Fourier series expansion as described in the following equation $$i_{PA}(t) = \sum_{n=1}^{N} \frac{2}{n\pi} \left\{ I_1(1 - \cos n\pi) + I_2 \left( \cos\frac{n\pi}{4} - \cos\frac{3n\pi}{4} \right) \right\} \cos n\omega_{Tx} t \quad (1)$$

where $\omega_{TX} = 2\pi f_{TX}$ in which fix is the transmit frequency. It can be shown that for the current $I_2 = \sqrt{2} I_1$ the third and fifth harmonic currents get nulled out. For the load $R_L$ (as shown in FIG. 1, looking at load into the capacitor 114), the peak amplitude of the current $I_1$ can be obtained according to the following equation (2):

$$I_1 = \frac{V_{DD}}{2(R_L + R_{on\_50DC})} \quad (2)$$

and the peak amplitude of the current $I_2$ can be obtained according to the following equation (3):

$$I_1 + I_2 = \frac{V_{DD}}{2(R_L + R_{on\_25DC} \| R_{on\_50DC})} \quad (3)$$

Figure 6:
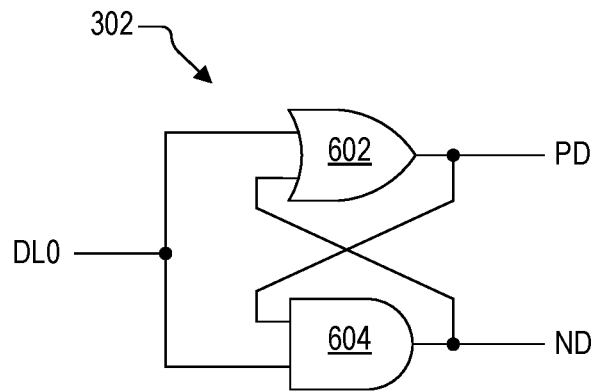
FIG. 6 is a schematic diagram of the non-overlap generation circuitry of FIG. 3 used for generating the PD and ND signals according to one embodiment of the present disclosure.

FIG. 6 is a schematic diagram of the non-overlap generation circuitry 302 used for generating the PD and ND signals according to one embodiment of the present disclosure. The non-overlap generation circuitry 302 includes a 2-input Boolean logic OR gate 602 and a 2-input Boolean logic AND gate 604 cross-coupled together. DL0 is provided to one input each of the OR gate 602 and the AND gate 604. The output of the OR gate 602 provides the PD signal which is further fed back to the other input of the AND gate 604, and the output of the AND gate 604 provides the ND signal which is further fed back to the other input of the OR gate 602.

As previously described in relation to FIG. 3, the PD and ND signals are selected when HS_EN is de-asserted for disabling harmonic suppression when additional harmonic rejection is not required. The non-overlapping signals PD and ND are used in the latter mode to suppress potentially high shoot through current during the transition of the gate signals to the pull-up and pull-down devices in the PA output slice 402.

Figure 7:
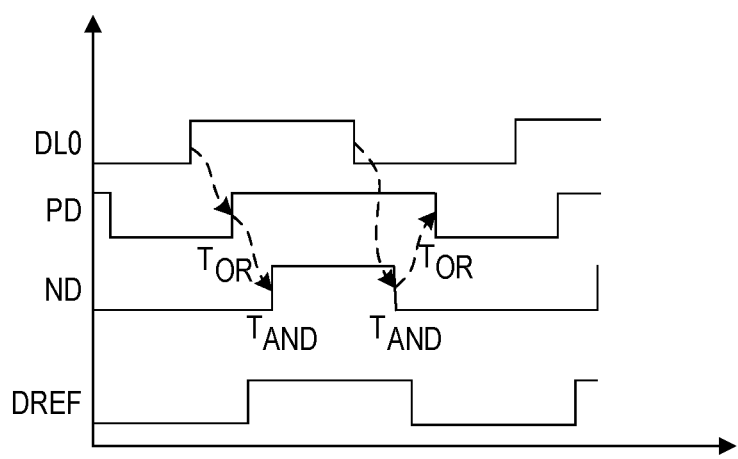
FIG. 7 is a timing diagram plotting the 50% duty cycle signal along with the corresponding non-overlapping PD and ND signals and a delayed 50% duty cycle reference signal according to one embodiment of the present disclosure.

FIG. 7 is a timing diagram plotting the DL0 signal along with the corresponding non-overlapping PD and ND signals and a delayed 50% DC reference signal according to one embodiment of the present disclosure. Generally, the PD and ND signals have their rising and falling edges skewed by a delay of $-T_{AND}$ (delay associated with the AND gate 604) or $T_{OR}$ (delay associated with the OR gate 602) with respect to each other to ensure the non-overlap between the signals driving complementary (P-type and N-type) transistors of the PA output slice 402. Such non-overlap of the signals avoids generating high shoot-through current which would otherwise occur if VDD was momentarily coupled to GND through series-coupled transistors that are both turned on at the same time. In the Harmonic Reject enabled case the switches are configured in the high impedance state at the crossover point of the 50DC signals and hence the shoot through current is minimal. Moreover, the harmonic cancellation does not happen as effectively if the 50DC signals are reduced in duty cycle to ensure non-overlap (e.g., made 48DC with the effectiveness reducing based on the amount of non-overlap e.g., 2DC).

Figure 8:
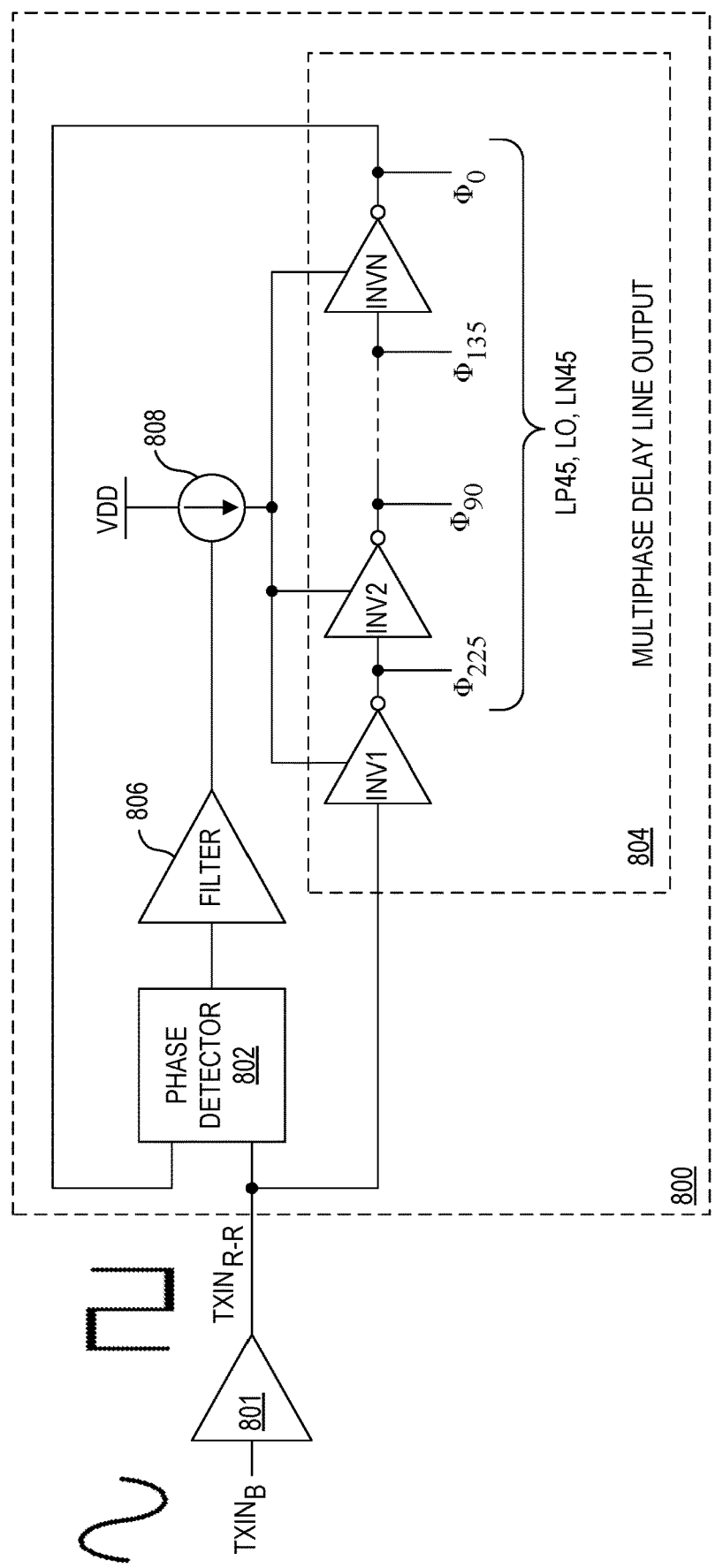
FIG. 8 is a simplified schematic and block diagram of a delay-locked loop (DLL) which may be used to replace the polyphase filter and the limiting amplifier circuitry of polyphase converter of FIG. 1 for an alternative method for generating the combination of 50% and 25% duty cycle signals according to another embodiment of the present disclosure.

FIG. 8 is a simplified schematic and block diagram of a delay-locked loop (DLL) 800 which may be used to replace the polyphase filter 104 and the limiting amplifier circuitry 106 of polyphase converter 122 for an alternative method for generating the combination of 50% and 25% duty cycle signals according to another embodiment of the present disclosure. The buffered input signal $TXIN_B$ is provided through a limiting amplifier 801, which converts the sinusoidal input signal to a rail-to-rail input signal $TXIN_{R-R}$ which is provided to one input of a phase detector 802 and to the input of a delay line 804 of the DLL 800. The delay line 804 may be implemented with N inverting buffers serially coupled together, individually shown as INV1, INV2, ..., INVN. In one embodiment, N=8, although any number of series-coupled inverters in multiples of 8 may be included. The output of the delay line 804 at the output of the last inverting buffer INVN is fed back to the other input of the phase detector 802. The phase detector 802 has an output coupled to an input of a loop filter 806, having an output coupled to a control input of a current source 808. The current source 808 is referenced to VDD (or other reference voltage) and has an output provided to the upper supply inputs of each of the inverting buffers INV1-INVN of the delay line 804. Although not specifically shown, each of the inverting buffers INV1-INVN has low supply inputs reference to GND.

The outputs of each of the inverting buffers INV1-INVN of the delay line 804 forms a multi-phase delay line output, in which selected ones of the outputs may be used as the LP45, L0, and LN45 signals. In one embodiment, since the outputs of the selected inverters are limiting in that they are rail-to-rail, the limiting amplifier circuitry 106 may be omitted. In an alternative embodiment, the limiting amplifier circuitry 106 may still be included for buffering. In one embodiment for N=8, 3 of the 8 possible output phases with phase angle k×45° may be used to generate the relevant LN45, L0, and LP45 signals, in which k corresponds to any 3 consecutive elements of the set {0, 1, 2, 3, 4, 5, 6, 7}.

Figure 9:
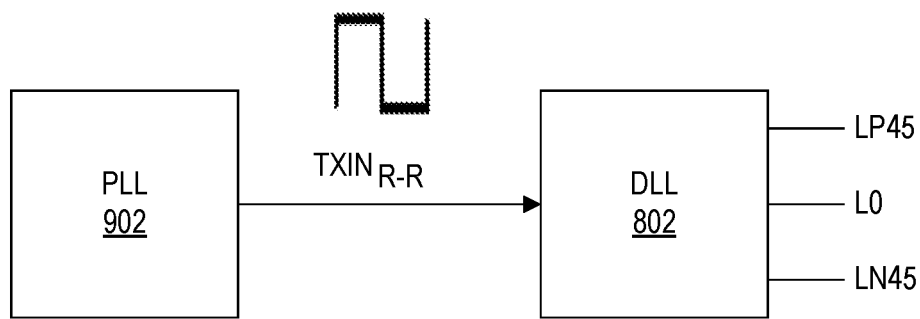
FIG. 9 is a simplified block diagram of alternative embodiment for directly receiving the rail-to-rail input signal $TXIN_{R-R}$ and providing the LP45, L0, and LN45 signals according to another embodiment of the present disclosure.

FIG. 9 is a simplified block diagram of alternative embodiment for directly receiving the rail-to-rail input signal $TXIN_{R-R}$ and providing the LP45, L0, and LN45 signals according to another embodiment of the present disclosure. A phase-locked loop (PLL) circuit 902 generates and provides the phase or frequency modulated signal $TXIN_{R-R}$, which is provided to the input of the DLL 800. Selected outputs of the DLL 800 provide the LP45, L0, and LN45 signals as previously described.

The present description has been presented to enable one of ordinary skill in the art to make and use the present invention as provided within the context of particular applications and corresponding requirements. The present invention is not intended, however, to be limited to the particular embodiments shown and described herein, but is to be accorded the widest scope consistent with the principles and novel features herein disclosed. Many other versions and variations are possible and contemplated. Those skilled in the art should appreciate that they can readily use the disclosed conception and specific embodiments as a basis for designing or modifying other structures for providing the same purposes of the present invention without departing from the spirit and scope of the invention.

The invention claimed is:

1. A switching power amplifier, comprising:
   a polyphase converter that is configured to convert a frequency or phase modulated input signal into a plurality of rail-to-rail signals that each transition between a first rail and a second rail, including a 50% duty cycle rail-to-rail signal, a positive 25% duty cycle rail-to-rail signal that is high 25% of the time while being centered within the 50% duty cycle rail-to-rail signal when high, and a negative 25% duty cycle rail-to-rail signal that is low 25% of the time while being centered within the 50% duty cycle rail-to-rail signal when low; and
   a power amplifier stage, comprising:
      a first branch comprising a first P-channel transistor having current terminals coupled between an upper node and an intermediate output node and having a control terminal receiving the 50% duty cycle rail-to-rail signal, and a first N-channel transistor having current terminals coupled the intermediate output node and a lower node and having a control terminal receiving the 50% duty cycle rail-to-rail signal; and
      a second branch comprising a second P-channel transistor having current terminals coupled between the upper node and the intermediate output node and having a control terminal receiving the negative 25% duty cycle rail-to-rail signal, and a second N-channel transistor having current terminals coupled between the intermediate output node and the lower node and having a control terminal receiving the positive 25% duty cycle rail-to-rail signal.

2. The switching power amplifier of claim 1, wherein the polyphase converter is configured to transition the negative 25% duty cycle rail-to-rail signal to activate the second P-channel transistor for about 25% of each cycle, and wherein the polyphase converter is configured to transition the positive 25% duty cycle rail-to-rail signal to activate the second N-channel transistor for about 25% of each cycle.

3. The switching power amplifier of claim 1, wherein the polyphase converter comprises:
   a polyphase filter that is configured to convert the input signal comprising a sinusoidal input signal into a positive 45 degree phase-shifted sinusoidal signal, a non-shifted amplitude adjusted sinusoidal signal, and a negative 45 degree phase-shifted sinusoidal signal;
   limiting amplifier circuitry that is configured to convert the positive 45 degree phase-shifted sinusoidal signal, the non-shifted amplitude adjusted sinusoidal signal, and the negative 45 degree phase-shifted sinusoidal signal into a positive 45 degree phase-shifted rail-to-rail signal, a non-shifted rail-to-rail signal, and a negative 45 degree phase-shifted rail-to-rail signal, respectively; and
   combinational circuitry that is configured to logically combine the positive and negative 45 degree phase-shifted rail-to-rail signals into the positive 25% duty cycle rail-to-rail signal and into the negative 25% duty cycle rail-to-rail signal, and that comprises a delay matching buffer that is configured to delay the non-shifted rail-to-rail signal to provide the 50% duty cycle rail-to-rail signal delay matched with the positive and negative 25% duty cycle rail-to-rail signals.

4. The switching power amplifier of claim 3, wherein the polyphase filter comprises:
   a high-pass capacitor-resistor filter having an input coupled to an input node for receiving the sinusoidal input signal and having an output providing the positive 45 degree phase-shifted sinusoidal signal;
   a capacitive attenuating matching circuit having an input coupled to the input node and having an output providing the non-shifted amplitude adjusted sinusoidal signal; and
   a low-pass resistor-capacitor filter having an input coupled to the input node and having an output providing the negative 45 degree phase-shifted sinusoidal signal.

5. The switching power amplifier of claim 4, wherein the high-pass capacitor-resistor filter, the capacitive attenuating matching circuit, and the low-pass resistor-capacitor filter are each tuned based on a predetermined transmission frequency.

6. The switching power amplifier of claim 3, wherein the limiting amplifier circuitry comprises a plurality of amplitude limiting buffers.

7. The switching power amplifier of claim 3, wherein the combinational circuitry comprises:
   a Boolean logic OR gate having inputs receiving the positive 45 degree phase-shifted rail-to-rail signal and the negative 45 degree phase-shifted rail-to-rail signal and having an output providing the negative 25% duty cycle rail-to-rail signal; and
   a Boolean logic AND gate having inputs receiving the positive 45 degree phase-shifted rail-to-rail signal and the negative 45 degree phase-shifted rail-to-rail signal and having an output providing the positive 25% duty cycle rail-to-rail signal.

8. The switching power amplifier of claim 1, wherein the polyphase converter comprises:
   a delay-locked loop that is configured to convert the input signal comprising a rail-to-rail input signal into a positive 45 degree phase-shifted rail-to-rail signal, a non-shifted rail-to-rail signal, and a negative 45 degree phase-shifted rail-to-rail signal; and
   combinational circuitry that is configured to logically combine the positive and negative 45 degree phase-shifted rail-to-rail signals into the positive 25% duty cycle rail-to-rail signal and into the negative 25% duty cycle rail-to-rail signal, and that comprises a delay matching buffer that is configured to delay the non-shifted rail-to-rail signal to provide the 50% duty cycle rail-to-rail signal delay matched with the positive and negative 25% duty cycle rail-to-rail signals.

9. The switching power amplifier of claim 8, wherein the delay-locked loop comprises:
   a phase detector having a first input receiving the rail-to-rail input signal, having a second input, and having an output;
   a delay line comprising a plurality of series-coupled inverters including a first inverter having an input receiving the rail-to-rail input signal and including a last inverter having an output coupled to the second input of the phase detector;
   a loop filter having an input coupled to the output of the phase detector and having an output; and
   a controlled current source having a control input coupled to the output of the loop filter and having an output coupled to a supply input of each of the series-coupled inverters of the delay line;
   wherein selected ones of outputs of the plurality of inverters are used to generate the 50% duty cycle rail-to-rail signal, the positive 25% duty cycle rail-to-rail signal, and the negative 25% duty cycle rail-to-rail signal.

10. The switching power amplifier of claim 8, further comprising an amplitude limiting buffer that converts a sinusoidal input signal into the rail-to-rail input signal.

11. The switching power amplifier of claim 8, further comprising a phase-locked loop that provides the frequency or phase modulated input signal.

12. The switching power amplifier of claim 1, wherein the first branch is configured to generate a first output current having about a 50% duty cycle, and wherein the second branch is configured to generate a second output current having about a 25% duty cycle that is superimposed with the first output current.

13. The switching power amplifier of claim 1, further comprising:
non-overlap generation circuitry having an input receiving the 50% duty cycle rail-to-rail signal, having a first output providing a P-type drive rail-to-rail signal and having second output providing an N-type drive rail-to-rail signal, wherein the P-type drive and N-type drive rail-to-rail signals have skewed transitions to prevent overlapping transitions with respect to each other; and
select circuitry that is configured to convey the 50% duty cycle rail-to-rail signal and the positive and negative 25% duty cycle rail-to-rail signals to the power amplifier stage when harmonic suppression is enabled, and when harmonic suppression is disabled, that is configured to convey the P-type drive rail-to-rail signal to the control terminals of the first and second P-channel transistors, and that conveys the N-type drive rail-to-rail signal to the control terminals of the first and second N-channel transistors.

14. A method of suppressing harmonics of a switching power amplifier, comprising:
converting a frequency or phase modulated input signal into a plurality of rail-to-rail signals that each transition between a first rail and a second rail, including a 50% duty cycle rail-to-rail signal, a positive 25% duty cycle rail-to-rail signal that is high 25% of the time while being centered within the 50% duty cycle rail-to-rail signal when high, and a negative 25% duty cycle rail-to-rail signal that is low 25% of the time while being centered within the 50% duty cycle rail-to-rail signal when low;
driving an upper P-channel transistor and a lower N-channel transistor of a first branch of a power amplifier circuit with the 50% duty cycle rail-to-rail signal;
driving an upper P-channel transistor of a second branch that is coupled in parallel with the first branch of the power amplifier circuit with the negative 25% duty cycle rail-to-rail signal; and
driving a lower N-channel transistor of the second branch of the power amplifier circuit with the positive 25% duty cycle rail-to-rail signal.

15. The method of claim 14, wherein the converting a frequency or phase modulated input signal comprises:
shifting phase of a sinusoidal input signal forward by 45 degrees to provide a positive 45 degree phase-shifted sinusoidal signal;
shifting phase of the sinusoidal input signal backward by 45 degrees to provide a negative 45 degree phase-shifted sinusoidal signal;
adjusting amplitude of the sinusoidal input signal to provide a non-shifted amplitude adjusted sinusoidal signal;
converting amplitude of the positive 45 degree phase-shifted sinusoidal signal, the non-shifted amplitude adjusted sinusoidal signal, and the negative 45 degree phase-shifted sinusoidal signal to provide a positive 45 degree phase-shifted rail-to-rail signal, a non-shifted rail-to-rail signal, and a negative 45 degree phase-shifted rail-to-rail signal, respectively;
logically combining the positive 45 degree phase-shifted rail-to-rail signal and the negative 45 degree phase-shifted rail-to-rail signal to provide a positive 25% duty cycle rail-to-rail signal and a negative 25% duty cycle rail-to-rail signal; and
delaying the non-shifted rail-to-rail signal to provide a 50% duty cycle rail-to-rail signal that is delayed equally in time as a delay of the positive and negative 25% duty cycle rail-to-rail signals.

16. The method of claim 15, wherein:
said shifting phase of a sinusoidal input signal forward by 45 degrees comprises high pass filtering the sinusoidal input signal to provide the positive 45 degree phase-shifted sinusoidal signal;
wherein said shifting phase of the sinusoidal input signal backward by 45 degrees comprises low pass filtering the sinusoidal input signal to provide the negative 45 degree phase-shifted sinusoidal signal; and
wherein said adjusting amplitude of the sinusoidal input signal comprises capacitively attenuating the sinusoidal input signal to provide the non-shifted amplitude adjusted sinusoidal signal.

17. The method of claim 15, wherein said converting amplitude comprises passing the positive 45 degree phase-shifted sinusoidal signal, the non-shifted amplitude adjusted sinusoidal signal, and the negative 45 degree phase-shifted sinusoidal signal through first, second, and third amplitude limiting buffers, respectively, to provide the positive 45 degree phase-shifted rail-to-rail signal, the non-shifted rail-to-rail signal, and the negative 45 degree phase-shifted rail-to-rail signal, respectively.

18. The method of claim 15, wherein the logically combining comprises logically OR'ing the positive 45 degree phase-shifted rail-to-rail signal and the negative 45 degree phase-shifted rail-to-rail signal to provide the negative 25% duty cycle rail-to-rail signal, and logically AND'ing the positive 45 degree phase-shifted rail-to-rail signal and the negative 45 degree phase-shifted rail-to-rail signal to provide the positive 25% duty cycle rail-to-rail signal.

19. The method of claim 14, wherein the converting a frequency or phase modulated input signal comprises:
providing a rail-to-rail input signal to a delay-locked loop comprising a multiple phase delay line having selected outputs configured to provide a positive 45 degree phase-shifted rail-to-rail signal, a non-shifted rail-to-rail signal, and a negative 45 degree phase-shifted rail-to-rail signal;
logically combining the positive 45 degree phase-shifted rail-to-rail signal and the negative 45 degree phase-shifted rail-to-rail signal to provide a positive 25% duty cycle rail-to-rail signal and a negative 25% duty cycle rail-to-rail signal; and
delaying the non-shifted rail-to-rail signal to provide a 50% duty cycle rail-to-rail signal that is delayed equally in time as a delay of the positive and negative 25% duty cycle rail-to-rail signals.

20. The method of claim 14, further comprising:
generating a P-type drive rail-to-rail signal by logically OR'ing the 50% duty cycle rail-to-rail signal with an N-type drive rail-to-rail signal;
generating the N-type drive rail-to-rail signal by logically AND'ing the 50% duty cycle rail-to-rail signal with the P-type drive rail-to-rail signal, wherein the P-type drive and N-type drive rail-to-rail signals are non-overlapping; and disabling harmonic suppression by driving the upper P-channel transistors of the first and second branches of the power amplifier circuit with the P-type drive rail-to-rail signal and driving the lower N-channel transistors of the first and second branches of the power amplifier circuit with the N-type drive rail-to-rail signal.

* * * * *